United States Patent
Yamada

(10) Patent No.: US 6,831,409 B2
(45) Date of Patent: Dec. 14, 2004

(54) DISPLAY DEVICE WITH MINIMAL COLOR DEVIATION FOR VARIOUS VIEW ANGLES

(75) Inventor: Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/159,343

(22) Filed: May 31, 2002

(65) Prior Publication Data

US 2003/0034938 A1 Feb. 20, 2003

(30) Foreign Application Priority Data

Jun. 5, 2001 (JP) ..................... P2001-170128

(51) Int. Cl.$^7$ ............. H01J 1/62; H01J 63/04; B32B 19/00; B32B 9/00
(52) U.S. Cl. .............. 313/506; 313/503; 313/504; 313/509; 313/512; 313/112; 428/690; 428/917
(58) Field of Search ............... 313/503, 504, 313/506, 509, 512, 112; 428/690, 917

(56) References Cited

U.S. PATENT DOCUMENTS

| | | | |
|---|---|---|---|
| 5,674,636 A | | 10/1997 | Dodabalapur et al. |
| 5,891,554 A | | 4/1999 | Hosokawa et al. |
| 5,936,347 A | * | 8/1999 | Isaka et al. ............. 313/509 |
| 5,949,187 A | * | 9/1999 | Xu et al. ............... 313/504 |
| 6,091,197 A | * | 7/2000 | Sun et al. .............. 313/509 |

FOREIGN PATENT DOCUMENTS

| | | |
|---|---|---|
| EP | 1154676 A1 | 11/2001 |
| JP | 06-283271 | 10/1994 |
| WO | WO 01/39554 A1 | 5/2001 |

* cited by examiner

Primary Examiner—Nimeshkumard D. Patel
Assistant Examiner—Matt Hodges
(74) Attorney, Agent, or Firm—Sonnenschein, Nath & Rosenthal LLP

(57) ABSTRACT

In a display device in which a light emitting layer is interposed between a first electrode and a second electrode, and at least one of the light emitting layer and one of the first and second electrodes from which light is extracted functions as a cavity portion of a cavity structure for resonating light generated in the light emitting layer, the peak wavelength of internal emission spectrum inside the light emitting layer and the peak wavelength of multiple interference filter spectrum by the cavity portion are shifted from each other to adjust the RGB balance in the luminance variance under the existence of a view angle by adjusting that shift value.

5 Claims, 11 Drawing Sheets

DISPLAY DEVICE WITH MINIMAL COLOR DEVIATION FOR VARIOUS VIEW ANGLES

BACKGROUND OF THE INVENTION

1. Field of the Invention

This invention relates to a display device and, more particularly, to a spontaneous emission-type display device such as organic electroluminescense device.

2. Description of the Related Art

A device using electroluminescense of an organic material (hereinafter called "organic EL device") comprises an organic layer formed by stacking an organic hole transport layer or organic light emitting layer between a first electrode and a second electrode, and it is remarked as a spontaneous emission type display device capable of high-luminance emission by low-voltage direct current driving.

FIG. 1 shows a cross-sectional configuration of a central part of a transmission-type organic EL device as one of such organic EL devices. The organic EL device shown in FIG. 1 is made by stacking on a transparent substrate 1, sequentially from bottom to top, a transparent electrode 2, organic buffer layer 3, organic hole transport layer 4, organic light emitting layer 5 and metal electrode 6, such that light h generated in the organic light emitting layer 5 is extracted through the substrate 1.

In the organic EL device shown in FIG. 1, however, spectrums of respective colors in the light h generated in and extracted from the organic light emitting layer 5 having various emission colors have wide peak widths as shown in FIG. 2, and especially regarding the red light h, the peak wavelength is deviated to a lower wavelength. Therefore, with a display apparatus using such organic EL devices for color representation, it was impossible to obtain a sufficient color reproducibility range enough to display, for example, TV images.

To overcome this problem, it was proposed to interpose a dielectric mirror layer (not shown) between the substrate 1 and the transparent electrode 2 such that the dielectric mirror layer, transparent electrode 2, organic buffer layer 3, organic hole transport layer 4, organic light emitting layer 5 and metal electrode 6 form a cavity structure. In the organic EL device having this cavity structure, the light h generated in the organic light emitting layer 5 reciprocates between the dielectric mirror layer and the metal electrode 6, and only a part of the light having the resonant wavelength is extracted through the substrate 1. Therefore, light h having high peak intensity and a narrow spectrum can be extracted, and it is possible to enlarge the color reproducibility range of a display apparatus using such organic EL devices.

However, as the peak width of the spectrum of extracted light h is narrowed, as it is in the organic EL device having the above-mentioned cavity structure, dependency of the emission property on the view angle increases. For example, when the emission surface is viewed from an oblique direction, wavelength of the light h largely shifts and the emission intensity decreases. Therefore, it is important that the spectral width of the light extracted from the organic EL device is not narrow too much. However, the organic EL device mentioned above did not contemplate the dependency on the view angle in its design and could not maintain a sufficient color reproduction range over wide view angles.

Such dependency on the view angle is a serious problem especially for white that is very perceivable visually. FIG. 3 shows an example of calculation of view-angle dependency of the chromaticity of white. For liquid crystal or other type displays, allowable range of color deviation in the screen is approximately within $\Delta uv=0.015$. It is certainly as small as $\Delta uv=0.006$ when the view angle is 30° as shown in FIG. 3. However, when the view angle is 60°, however, it becomes as large as $\Delta uv=0.0178$. That is, it is apparent that the color deviation becomes very large beyond the allowable range. This calculation was carried out under the condition where peak wavelengths of multiple interference filter spectrums shown in FIG. 4 and peak wavelengths of internal emission spectrums shown in FIG. 5 by broken lines (spectrums of light emitted by light emitting layers and extracted without multiple interference) (more precisely, the peak wavelengths are those maximizing the efficiency of utilizing the light energy). In this case, the light energy extracting efficiency is maximized. Multiplication of the internal emission spectrums and the multiple interference filter spectrums results in the extracted light having the spectrums shown in FIG. 5 by solid lines.

OBJECTS AND SUMMARY OF THE INVENTION

It is therefore an object of the invention to provide a spontaneous emission type display device capable of adjusting the RGB balance in a luminance-variable quantity under the existence of a view-angle dependency and capable of alleviating the view-angle dependency of white.

According to the first aspect of the invention, there is provided a display device in which a light emitting layer is interposed between a first electrode and a second electrode, and at least one of the light emitting layer and one of the first and second electrodes from which light is extracted functions as a cavity portion of a cavity structure for resonating light generated in the light emitting layer, characterized in that the peak wavelength of internal emission spectrum inside the light emitting layer and the peak wavelength of multiple interference filter spectrum by the cavity portion are shifted from each other.

According to the second aspect of the invention, there is provided a display device in which a light emitting layer is interposed between a first electrode of a light reflective material and a second electrode of a transparent material, and at least one of the second electrode and the light emitting layer functions as a cavity portion of a cavity structure for resonating light generated in the light emitting layer, characterized in that the peak wavelength of internal emission spectrum inside the light emitting layer and the peak wavelength of multiple interference filter spectrum by the cavity portion are shifted from each other.

According to the third aspect of the invention, there is provided a display device in which a first electrode of a light reflective material, a light emitting layer and a second electrode of a transparent material are sequentially stacked on a substrate, and at least one of the second electrode and the light emitting layer functions as a cavity portion of a cavity structure for resonating light generated in the light emitting layer, characterized in that the peak wavelength of internal emission spectrum inside the light emitting layer and the peak wavelength of multiple interference filter spectrum by the cavity portion are shifted from each other.

In any of those aspects of the present invention, in the case where the phase shift occurring upon reflection of light generated in the light emitting layer at opposite ends of the cavity is Φ radians, the optical distance of the cavity is L, and the peak wavelength of the spectrum of the light to be extracted from the light generated in the light emitting layer is $\lambda_{max}$, the display device is configured to satisfy Equation (1) below.

$$2L/\lambda_{max} + \Phi/2\pi m \quad (m \text{ is an integer}) \tag{1}$$

In the display device having that configuration, since the optical length L of the cavity satisfies Equation (1), light near the wavelength $\lambda_{max}$ runs to multiple interference in the cavity.

In the present invention, color deviation $\Delta uv$ of white upon the view angle of 60° is held not to exceed 0.015 by shifting the peak wavelength of the internal emission spectrum in the light emitting layer and the peak wavelength of the multiple interference filter spectrum by the cavity from each other.

The present invention having the above-summarized configuration can adjust the RGB balance in luminance variable-quantity under the existence of a view-angle dependency by means of a deviation of the peak wavelength of the multiple interference filter spectrum relative to the peak wavelength of the internal emission spectrum.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention will be explained below with reference to the drawings. Display devices according to the embodiments explained here are some applications of the invention to organic EL devices. In all of the figures illustrating the embodiments, common or equivalent components are commonly labeled.

Figure 6:
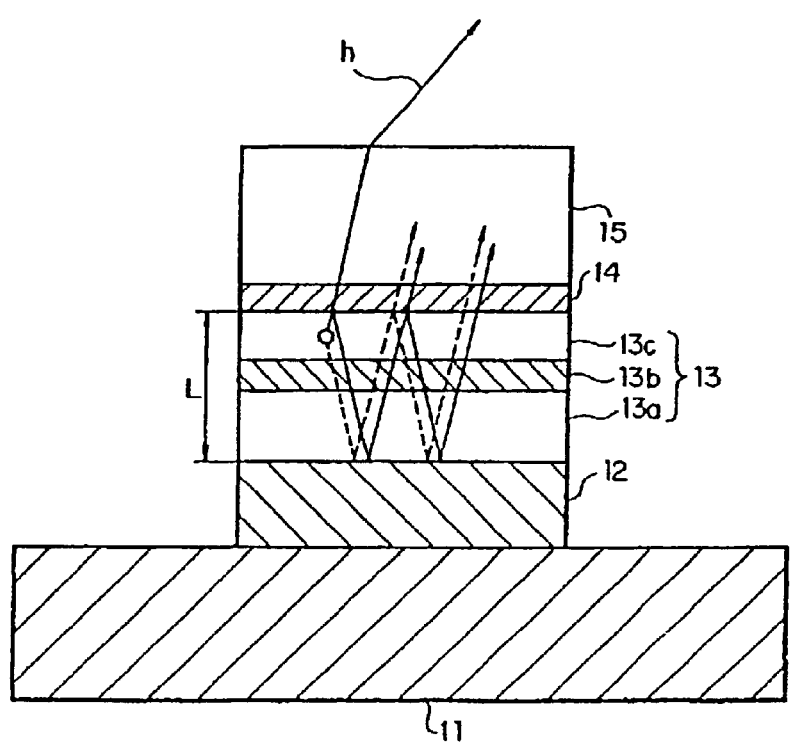
FIG. 6 is a cross-sectional view of the substantial part of an organic EL device according to the first embodiment of the invention.

FIG. 6 shows an organic EL device according to the first embodiment of the invention. The organic EL device shown in FIG. 6 is a so-called top emission type organic EL device, and includes a first electrode 12, organic layer 13, semitransparent reflection layer 14 and second electrode 15 stacked on a substrate 11 sequentially from bottom to top.

The substrate 11 is, for example, a transparent glass substrate, semiconductor substrate, or the like, and may be flexible.

The first electrode 12 is used as an anode electrode that functions as a reflection layer as well, and it is made of a light reflective material such as platinum (Pt), gold (Au), chromium (Cr), tungsten (W), or the like. The first electrode 12 preferably has a thickness in the range from 100 nm to 300 nm.

The organic layer 13 is made by stacking, for example, a buffer layer 13a, hole transport layer 13b and organic light emitting layer 13c also functioning as an electron transport layer, sequentially from bottom. The electron transport layer may be provided separately from the organic light emitting layer 13c. The buffer layer 13a is a layer for preventing leakage, and may be made of, for example, m-MTDATA [4, 4', 4"-tris (3-methylphenylphenylamino) triphenylamine], 2-TNATA [4, 4', 4"-tris (2-naphtylphenylamino) triphenylamine], or the like. The buffer layer 13a may be omitted if leakage is in an acceptable level. The hole transport layer 13b may be made of, for example, α-NPD [N, N'-di (1-naphthyl)-N, n'-diphenyl-[1, 1'-biphenyl]-4, 4'-diamine]. The organic light emitting layer 13c is made of different light emitting materials having emission colors of red (R), green (G) and blue (B). For example, as the light emitting material having the G emission color, Alq3 (tris-quinolinolaluminum complex) may be used.

These layers forming the organic layer 13 are preferably in specific thickness ranges, i.e. for the buffer layer 13a from 15 nm to 300 nm, for the hole transport layer 13b from 15 nm to 100 nm and for the organic light emitting layer 13c from 15 nm to 100 nm, respectively. However, thicknesses of the organic layer 13 and the layers forming it are determined so that their optical film thicknesses become the values explained later.

The semitransparent reflection layer 14 forms a cathode electrode, and it is made of, for example, magnesium (Mg), silver (Ag) or their alloy. The semitransparent reflection layer 14 preferably has a thickness in the range from 5 nm to 50 nm.

The second electrode 15 is made of a material typically used as a transparent electrode, such as indium tin oxide (ITO) or an oxide of indium and zinc. Let the second electrode 15 have a thickness in the range from 30 nm to 1000 nm. A passivation film (not shown) made of a transparent dielectric overlies the second electrode 15. The transparent dielectric preferably has a refractive index approximately equal to that of the material forming the second electrode 15. As such material, silicon oxide ($SiO_2$), silicon nitride (SiN), or the like, can be used, and may be stacked to a thickness from 500 nm to 10000 nm, for example.

In this EL device, the first electrode 12 of a light reflective material, organic layer 13 and semitransparent reflection layer 14 make up a cavity structure, and the organic layer 13 functions as a cavity portion. If L is the optical distance between the first electrode 12 and the semitransparent reflection layer 14, i.e. the optical thickness of the cavity portion made up of the organic layer 13; the phase shift produced upon reflection of light h generated in the organic light emitting layer 13c at the first electrode 12 and the semitransparent reflection layer 14 is $\Phi$ radians; and $\lambda$ is the wavelength of the light h generated in the organic light emitting layer 13c; then the phase delay $\delta$ in each single event of multiple interference is $$\delta = 2\pi \cdot 2L/\lambda + \Phi \quad (2)$$

The value of $\lambda$ simplifying Equation (2) to $$\delta = 2\pi \cdot m \text{ (}m\text{ is an integer)} \quad (3)$$

is the peak wavelength of the multiple-interference filter that is a narrow-band filter. If this is $\lambda_{max}$, Equations (2) and (3) give $$2L/\lambda_{max} + \Phi/2\pi = m \quad (4)$$

L is determined to satisfy Equation (4).

Thicknesses of respective layers forming the organic layer 13 are determined to satisfy it. Optical distance L of the cavity portion is determined by the following equation (5) from refractive indices n1, n2, ..., nk and thicknesses d1, d2, ..., dk of respective layers of the organic layer 13 (buffer layer 13a, hole transport layer 13b and organic light emitting layer 13c in the first embodiment).

$$L = n1 \times d1 + n2 \times d2 + \ldots + nk \times dk \quad (5)$$

An example of calculation of L is shown here. If the buffer layer 13a is made of 2-TNATA, the hole transport layer 13b is made of α-NPD, the organic light emitting layer 13c is made of Alq3, their thicknesses are d1=32 nm, d2=30 nm, d3=50 nm, respectively, and λ=535 nm, then n1=1.9, n2=1.8 and n3=1.7. Therefore, $$L = 1.9 \times 32 + 1.8 \times 30 + 1.7 \times 50 = 200 \text{ nm}$$

$\Phi$ is derived in the following manner. That is, first stacked on a substrate (for example, Si substrate) is the reflection layer (Cr, or the like) or a semitransparent reflection layer (Mg, Ag, Mg—Ag alloy, or the like) to a thickness not thinner than 200 nm. Then using a spectroellipsometric apparatus (for example, a product of the manufacturer SOPRA), refractive index n and absorption coefficient k of the reflection layer or semitransparent reflection layer are determined.

The phase shift of the reflection layer can be calculated from its n and k, and refractive index n of the organic layer in contact with the reflection layer (see, for example, Principles of Optics, Max Born and Emil Wolf, 1974 (PERGAMON PRESS)).

The phase shift of the semitransparent reflection layer can be similarly calculated by using its n and k, as well as refractive index n of the organic layer in contact with the semitransparent reflection layer, thickness of the semitransparent reflection layer, refractive indices and thicknesses of respective transparent films above it. Also the refractive indices of the organic layer and respective transparent films can be measured using a spectroellipsometric apparatus.

The sum of those two phase-shift amounts is $\Phi$.

As an exemplary value of $\Phi$, $\Phi = -4.7$ radians when λ=535 nm.

Figure 7:
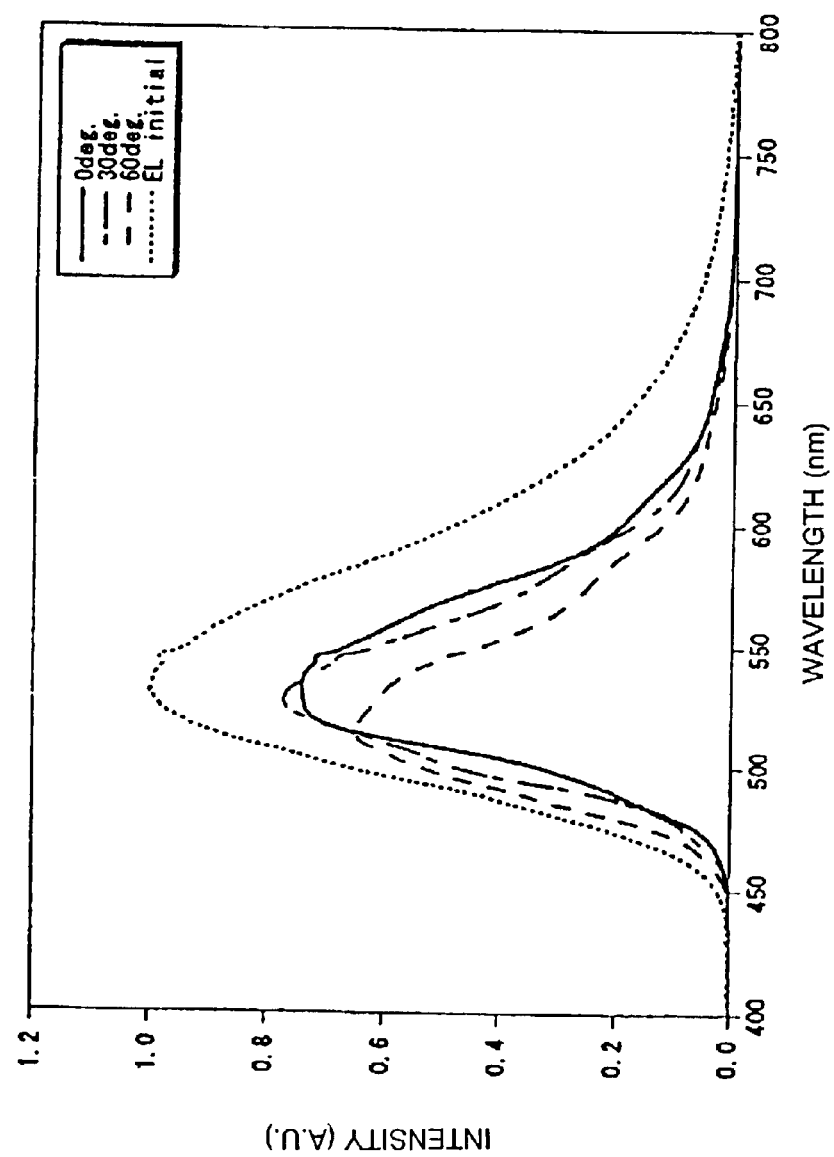
FIG. 7 is a schematic diagram that shows view-angle dependency of an organic EL device (G emission) as a comparative example with the organic EL device according to the first embodiment of the invention.
Figure 8:
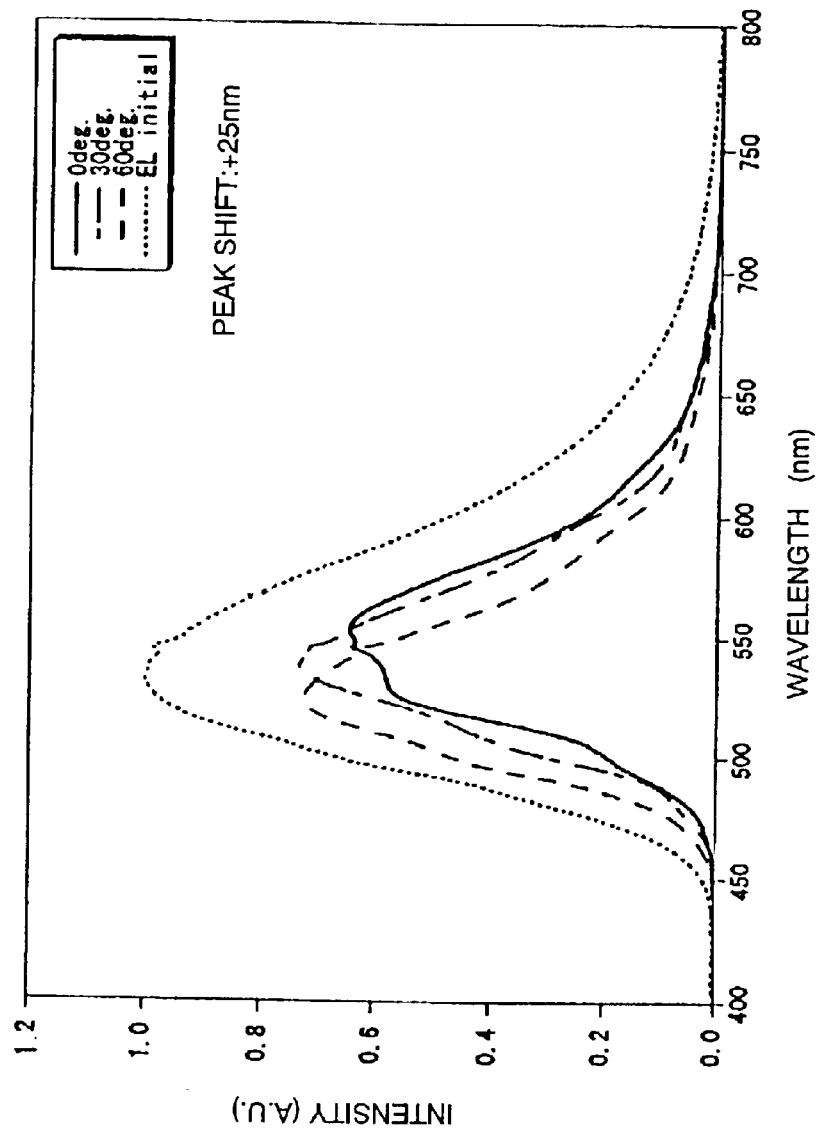
FIG. 8 is a schematic diagram that shows view-angle dependency of the organic EL device according to the first embodiment of the invention.

FIG. 7 shows calculated view-angle dependency of the spectrum of extracted light from green emission upon coincidence between the peak wavelength of the internal emission spectrum and the peak wavelength of multiple interference filter spectrum. There, m=0. As apparent from FIG. 7, as the view angle becomes large, the peak of the spectrum of the extracted light shifts toward shorter wavelengths, and the peak intensity also decreases. On the other hand, FIG. 8 shows calculated view-angle dependency of the spectrum of extracted light when the peak of the multiple interference filter spectrum shifts toward longer wavelengths by 25 nm than the peak of the internal emission spectrum. There, m=0. It is apparent from FIG. 8 that, once the view angle becomes large, the peak intensity once increases and thereafter decreases gradually.

Table 1 shows calculated changes of luminance in that case. It is known here that spectrums with no peak shift decrease in luminance as the view angle increases but spectrums with the peak shift of 25 nm toward longer wavelengths once increase in luminance and thereafter decrease. By variously changing the shift amount, changes of luminance can be varied variously.

TABLE 1

| Shift amount of | View Angle | | |
| --- | --- | --- | --- |
| peak wavelength | 0° | 30° | 60° |
| 0 nm | 1.0 | 0.95 | 0.76 |
| +25 nm | 1.0 | 1.03 | 0.95 |

On the other hand, chromaticity of white is determined when monochrome chromaticities of RGB and white luminance balance are given. That is, if monochrome chromaticities of RGB are R: $(x_r, y_r)$, G: $(x_g, y_g)$ and B: $(x_b, y_b)$, and white luminance balance is $Y_r : Y_g : Y_b$ (where $y_r + Y_g + Y_b = 1$), then the white chromaticity $(x_w, y_w)$ can be calculated from $$x_w = x_w'/(x_w' + 1 + z_w')$$

$$y_w = 1/(x_w' = 1 + z_w')$$

where $$x_w' = x_r \times Y_r/y_r + x_g + Y_g/y_g + x_b \times Y_b/y_b$$

$$Z_w' = (1 - x_r - y_r) \times Y_r/y_r + (1 - x_g - y_g) \times Y_g/y_g +$$

$$(1 - x_b - y_b) \times Y_b/y_b$$

When the view angle changes, monochrome chromaticities $(x_r, y_r)$, $(x_g, y_g)$ and $(x_b, y_b)$ change toward shorter wavelengths. Simultaneously, luminance varies as well, the white luminance balance $Y_r : Y_g : Y_b$ changes, and the chromaticity of white shifts according to the above equations.

Therefore, color deviation of white can be improved by changing the peak wavelength of the internal emission spectrum and the peak wavelength of the multiple interference filter spectrum, thereby to change the variance of luminance under the existence of a view angle and adjust the changing amount of the white luminance balance.

Figure 1:
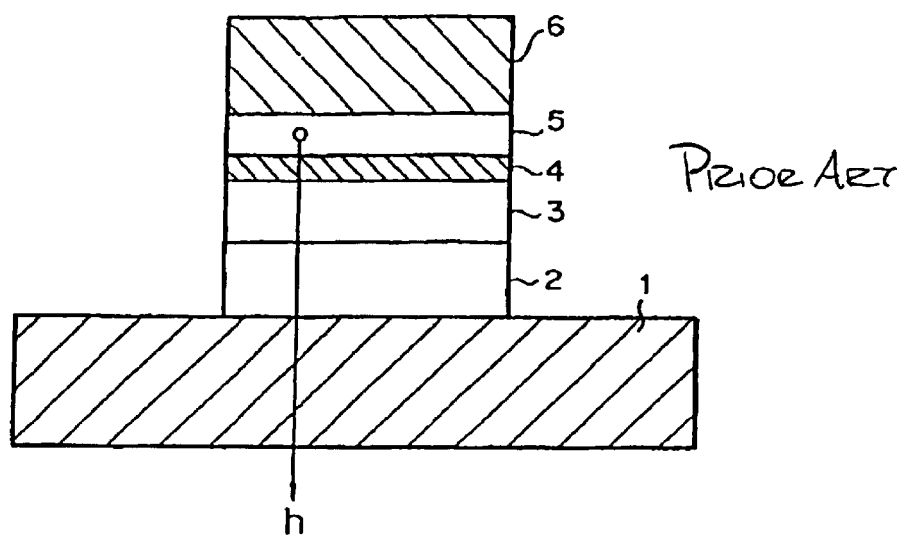
FIG. 1 is a cross-sectional view of the substantial part of a conventional organic EL device.
Figure 2:
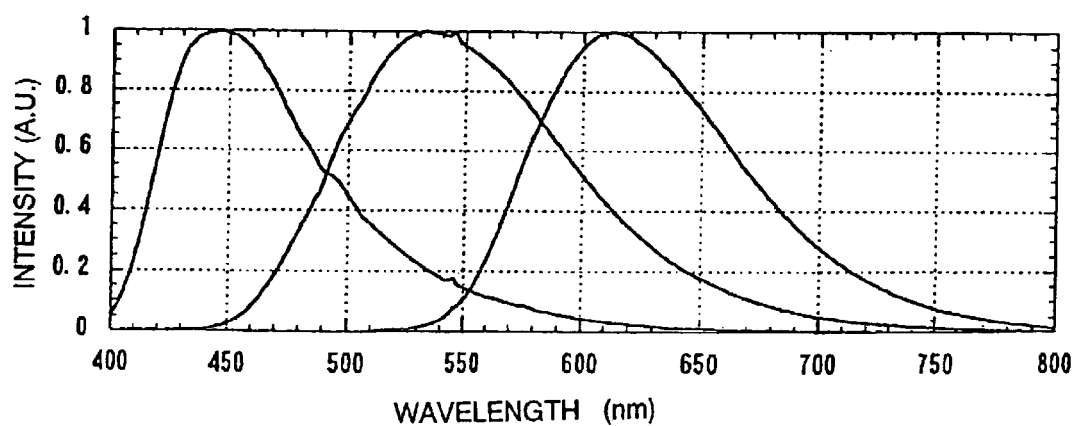
FIG. 2 is a schematic diagram that shows spectrums of respective colors extracted from the organic EL device.
Figure 3:
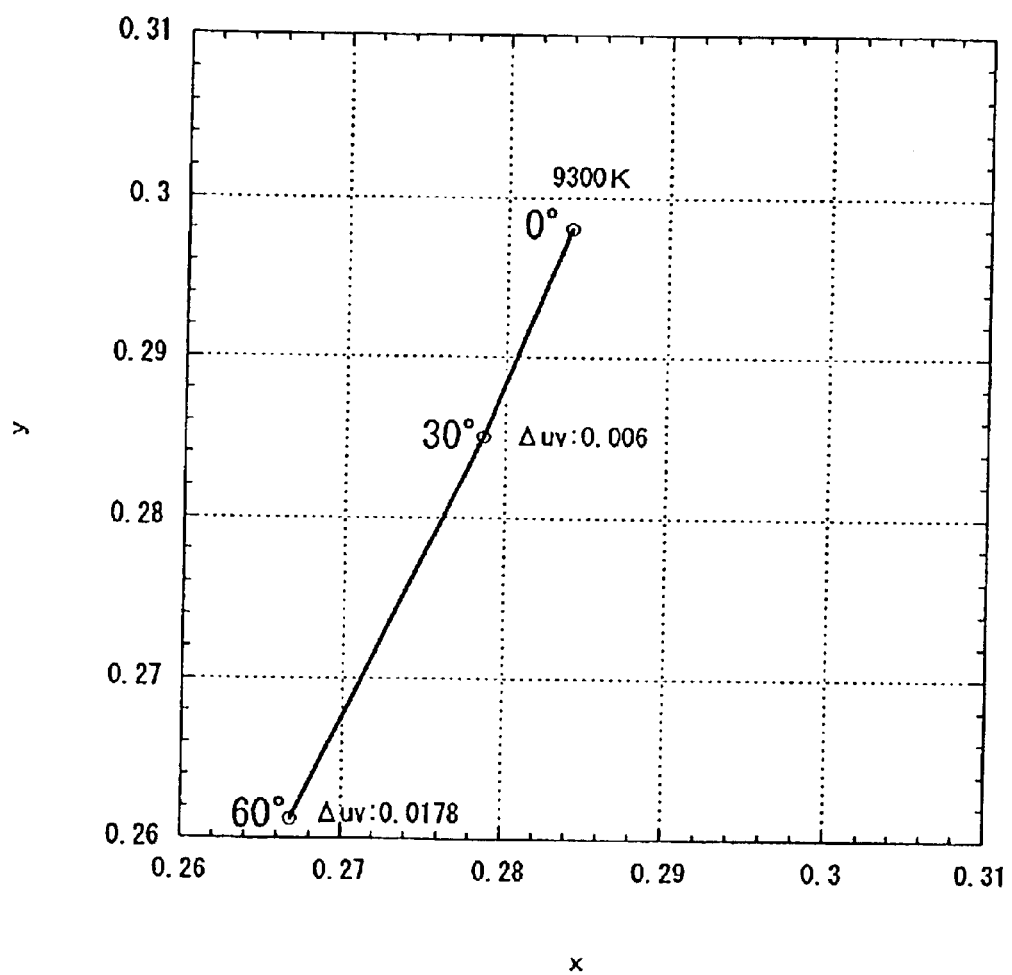
FIG. 3 is a schematic diagram that shows an UV chromaticity diagram of the conventional organic EL device.
Figure 4:
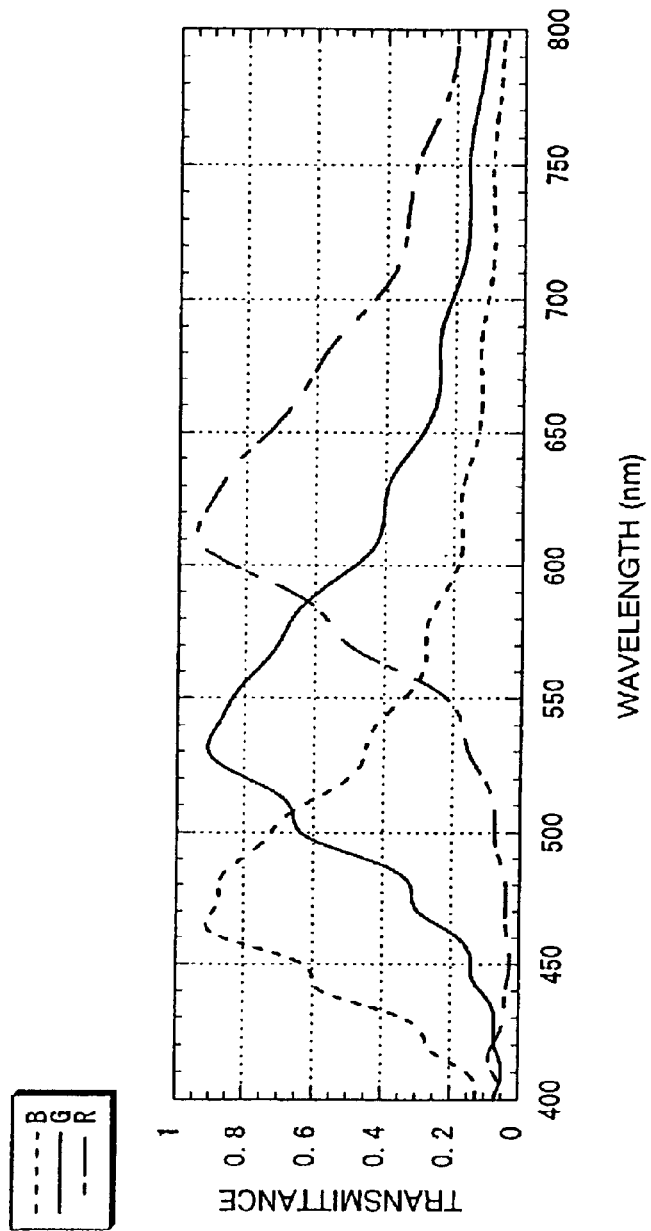
FIG. 4 is a schematic diagram that shows multiple interference filter spectrums in the conventional organic EL device.
Figure 5:
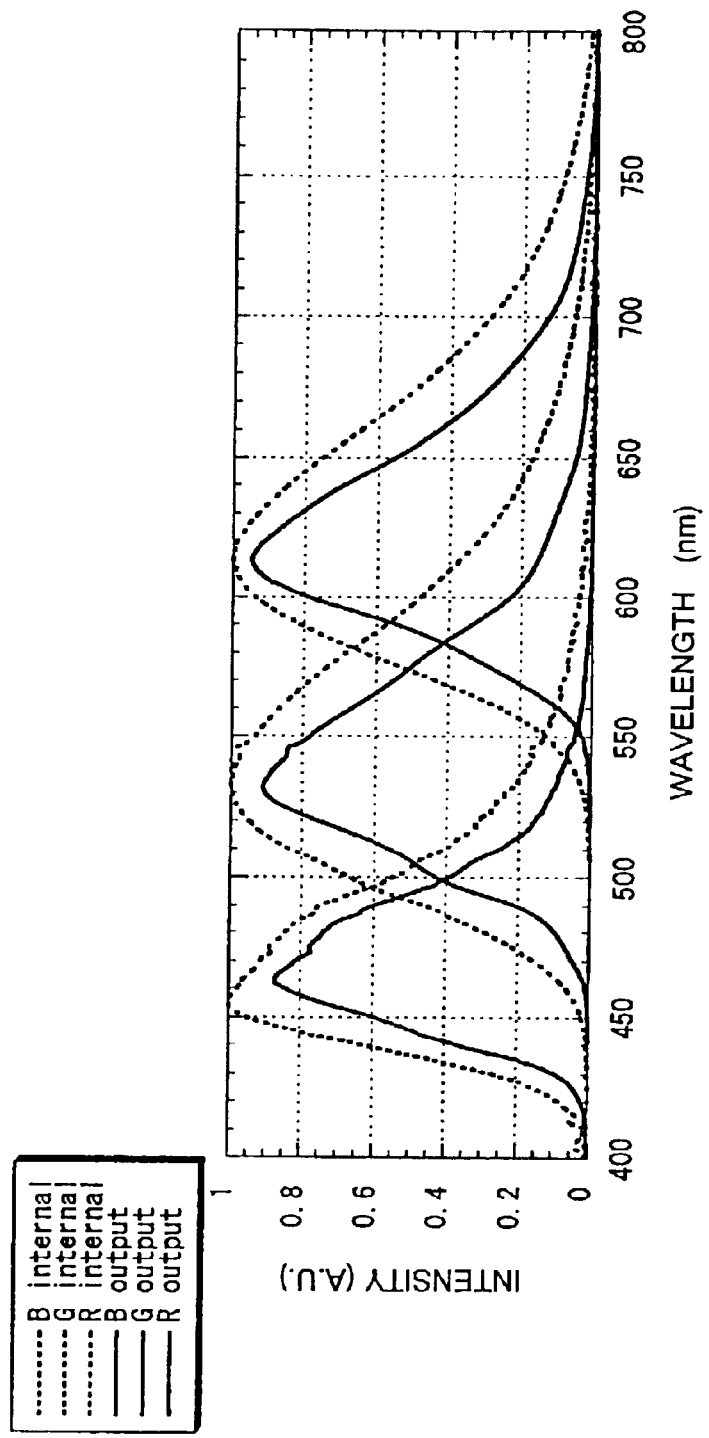
FIG. 5 is a schematic diagram that shows internal emission spectrums in the conventional organic EL device.
Figure 9:
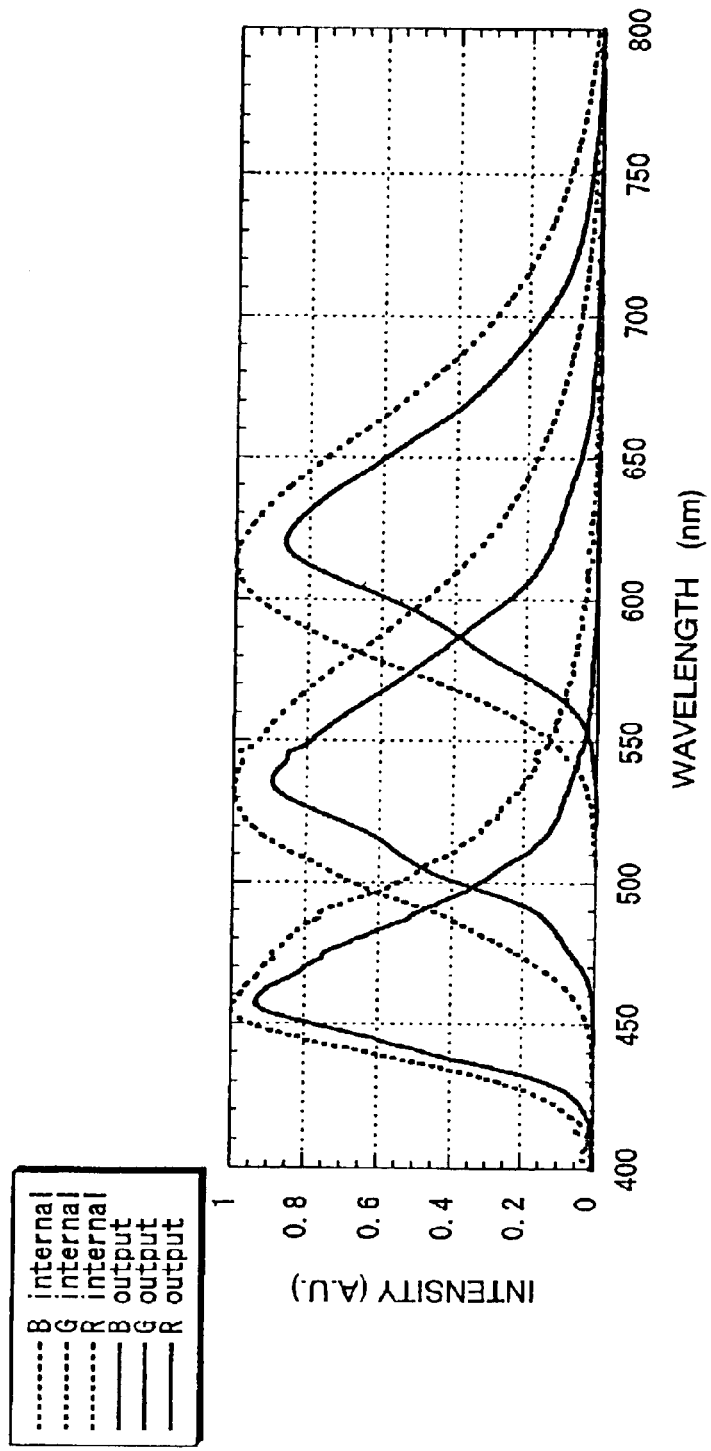
FIG. 9 is a schematic diagram that shows internal emission spectrums in the organic EL device according to the first embodiment of the invention and spectrums of extracted light.
Figure 10:
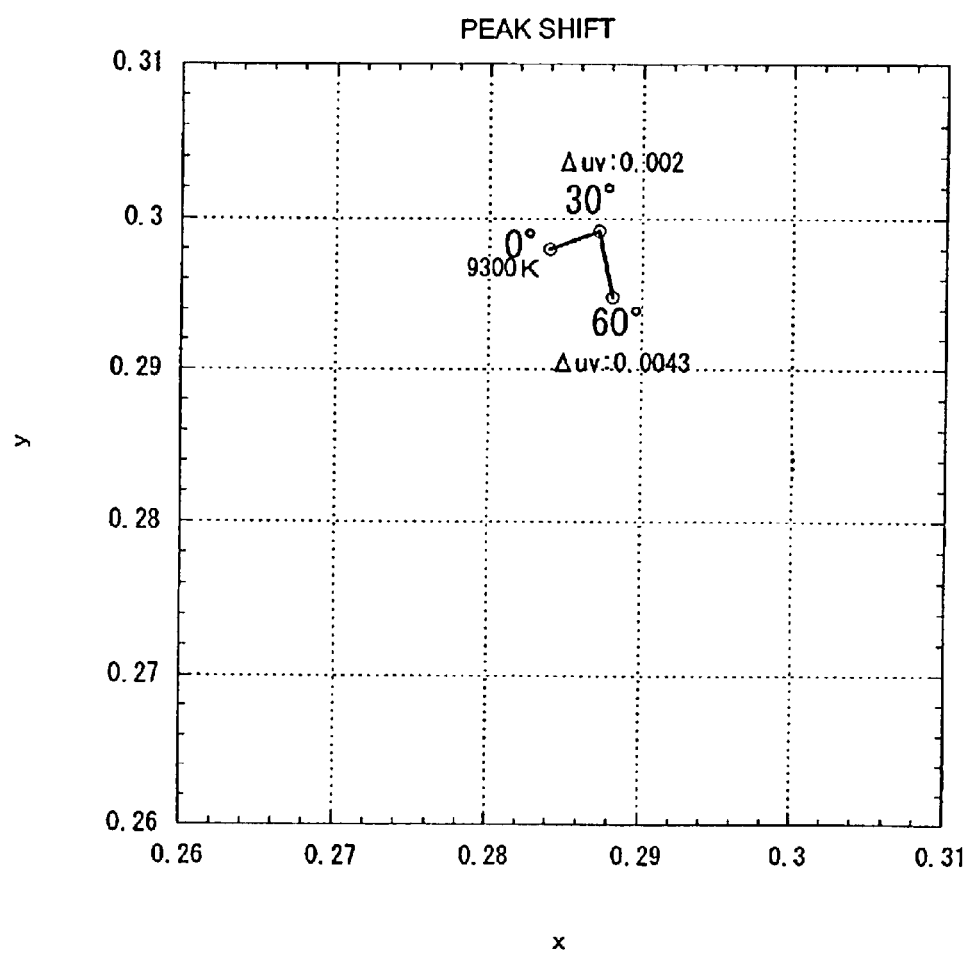
FIG. 10 is a schematic diagram that shows an UV chromaticity diagram of the organic EL device according to the first embodiment of the invention.

A result of such improvement is shown. That is, in case of the internal emission spectrum and the spectrum of extracted light as shown in FIG. 9, by shifting the peak wavelength of multiple interference filter spectrum of red (R) by +10 nm, the peak wavelength of multiple interference filter spectrum of green (G) by +4 nm and the peak wavelength of multiple interference filter spectrum of blue (B) by −10 nm, color deviation of white could be reduced significantly as much as Δuv=0.002 at 30° and Δuv=0.0043 at 60° as shown in FIG. 10 as compared with the conventional example shown in FIG. 4.

As explained above, the first embodiment, configured to shift the peak wavelength of multiple interference filter spectrum from the peak wavelength of the internal emission spectrum, can adjust the RGB balance in the luminance changing amount, and thereby can significantly reduce the view-angle dependency of white. Additionally, by shifting the peak wavelength of multiple interference filter spectrum of R to a longer wavelength and that of B to a shorter wavelength, these colors can be adjusted deeper in chromaticity.

Figure 11:
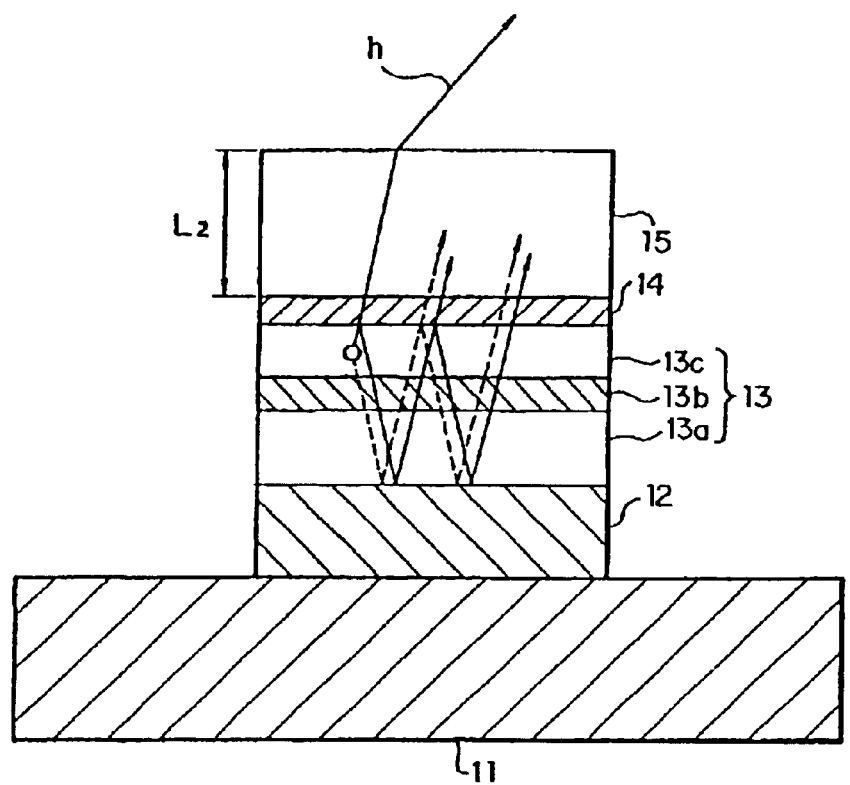
FIG. 11 is a cross-sectional view of the substantial part of an organic EL device according to the second embodiment of the invention.

FIG. 11 shows an organic EL device according to the second embodiment of the invention. The organic EL device shown in FIG. 11 is modified from the organic EL device according to the first embodiment shown in FIG. 6 in that a cavity structure is made up of the transparent reflection layer 14, second electrode 15 and top end interface of the second electrode 15 (for example, interface with the atmospheric layer). Reflectance of the interface between the end surface of the second electrode 15 and the atmospheric layer is as large as 10% approximately, and here is used the effect of the cavity having the second electrode 15 of a transparent material as its cavity portion.

Therefore, distance between the atmospheric layer and the semitransparent reflection layer 14, i.e. the optical distance of the cavity portion made up of the second electrode 15, becomes L (it is designated here by $L_2$ for distinction from the first embodiment).

In case a passivation film of a transparent dielectric material having a refractive index equivalent to the second electrode 15 is provided on the second electrode 15, the passivation film and the second electrode 15 function as the cavity portion.

In the other respects, this embodiment is the same as the first embodiment, so their detailed explanation is omitted here.

The second embodiment also ensures the same advantages as those of the first embodiment.

Figure 12:
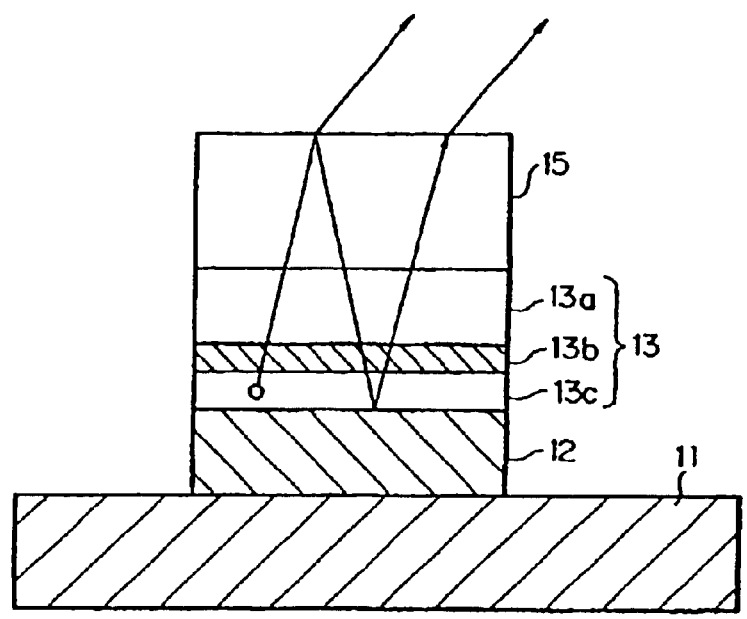
FIG. 12 is a cross-sectional view of the substantial part of an organic EL device according to the third embodiment of the invention.

FIG. 12 shows an organic EL device according to the third embodiment of the invention. In the organic EL device shown in FIG. 12, the first electrode 12 is a cathode electrode of a light reflective material, the second electrode 15 is an anode electrode of a transparent electrode material, and the organic light emitting layer 13c, hole transport layer 13b and buffer layer 13a are stacked sequentially from near the first electrode 12. In this case, the organic layer 13 and the second electrode 15 are combined to form one cavity portion to reflect light generated in the organic light emitting layer 13c at the lower end of the organic layer 13 (interface with the first electrode 12) and the upper end of the second electrode 14 (interface with the atmospheric layer). Optical distance between the organic layer 13 and the second electrode 15 is L.

In case a passivation film of a transparent dielectric material having a refractive index equivalent to the second electrode 15 is provided on the second electrode 15, the passivation film and the second electrode 15 function as the cavity portion.

In the other respects, this embodiment is the same as the first embodiment, so their detailed explanation is omitted here.

The third embodiment also ensures the same advantages as those of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures, shapes, materials, etc. shown in the foregoing embodiments are not but mere examples, and other appropriate numerical values, structures, shapes, materials, and so forth, can be used.

More specifically, in the first embodiment, the anode electrode is the first electrode 12 in form of a metal film having a high work function. However, the anode electrode may be formed in a two-layered structure in which a transparent conductive film is stacked on a reflection film dielectric multi-layered film made of a dielectric multi-layered film or aluminum (Al), for example. In this case, the reflection film functions as the first electrode in the present invention, and the transparent conductive film forms a part of the cavity portion.

In the third embodiment, the semitransparent reflection layer (not shown) made of a material having a high work function, such as Pt, Au or Cr, may be located between the organic layer 13 and the second electrode 15. In this case, the structure of the cavity portion is the same as those of the first embodiment and the second embodiment.

The first to third embodiments have been explained as applying the present invention to surface emission type organic EL devices. The invention, however, is also applicable to transmission type organic EL devices using a transparent substrate 11. It is also applicable to an organic EL device connected to a thin-film transistor on the substrate 11.

When necessary, an organic EL device may be made up by combining those embodiments. For example, the second embodiment may be combined with the first embodiment to make up an organic EL device. Configuration of the cavity portion explained in conjunction with the second embodiment is also applicable to a cavity portion made up of the organic layer 13. However, considering that the cavity portion explained in conjunction with the second embodiment uses the cavity portion having a relatively large thickness, it is suitable for a configuration in which the cavity portion is the second electrode 15 having relatively high freedom toward higher thicknesses. Configuration of the cavity portion explained in conjunction with the first embodiment is applicable also to a cavity portion made up of the second electrode 15 (and the overlying passivation film).

As described above, according to the invention shifting the peak wavelength of the emission spectrum inside the light emitting layer and the peak wavelength of the multiple interference filter spectrum from each other can adjust the RGB balance in the luminance variance under the existence of view-angle dependency by making use of the shift amount between the peak wavelengths, and thereby can decrease the view-angle dependency of white.

What is claimed is:

1. A display device in which a light emitting layer is interposed between a first electrode and a second electrode wherein light is extraded from said second electrode and said second electrode is above said first electrode, and at least one of said light emitting layer and said second electrode functions as a cavity portion of a cavity structure for resonating light generated in said light emitting layer, characterized in that the peak wavelength of internal emission spectrum inside said light emitting layer and the peak wavelength of multiple interference filter spectrum by said cavity portion are shifted from each other so that color deviation Δ uv of white under the view angle of 60° is adjusted not to exceed 0.015.

2. A display device in which a light emitting layer is interposed between a first electrode of a light reflective material and a second electrode of a transparent material wherein said second electrode is above said first electrode, and at least one of said second electrode and said light emitting layer functions as a cavity portion of a cavity structure for resonating light generated in said light emitting layer, characterized in that the peak wavelength of internal emission spectrum inside said light emitting layer and the peak wavelength of multiple interference filter spectrum by said cavity portion are shifted from each other so that color deviation Δ uv of white under the view angle of 60° is adjusted not to exceed 0.015.

3. A display device in which a first electrode of a light reflective material, a light emitting layer and a second electrode of a transparent material are sequentially stacked on a substrate wherein said second electrode is above said first electrode, and at least one of said second electrode and said light emitting layer functions as a cavity portion of a cavity structure for resonating light generated in said light emitting layer, characterized in that the peak wavelength of internal emission spectrum inside said light emitting layer and the peak wavelength of multiple interference filter spectrum by said cavity portion as shifted from each other so that color deviation Δ uv of white under the view angle of 60° is adjusted not to exceed 0.015.

4. The display device according to claim 1,2, or 3 wherein in the case where the phase shift occurring upon reflection of light generated in said light emitting layer at opposite ends of said cavity is Φ radians, the optical distance of said cavity is L, and the peak wavelength of the spectrum of the light to be extracted from the light generated in said light emitting layer is $\lambda_{max}$, Equation (1) below $$2L/\lambda_{max} - \Phi/2\pi = m \quad (m \text{ is an integer}) \tag{1}$$

is satisfied.

5. The display device according to claim 4, wherein m equals 0.

* * * * *